United States Patent
Wu et al.

(10) Patent No.: US 12,250,790 B2
(45) Date of Patent: Mar. 11, 2025

(54) LIQUID COOLING DEVICE

(71) Applicants: INVENTEC (PUDONG) TECHNOLOGY CORPORATION, Shanghai (CN); INVENTEC CORPORATION, Taipei (TW)

(72) Inventors: Jiang-Jun Wu, Shanghai (CN); Yi-Dong Ji, Shanghai (CN); Shu-Kang Han, Shanghai (CN); Ke Sun, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 256 days.

(21) Appl. No.: 18/123,452

(22) Filed: Mar. 20, 2023

(65) Prior Publication Data
US 2024/0090168 A1    Mar. 14, 2024

(30) Foreign Application Priority Data
Sep. 9, 2022    (CN) .......................... 202211104761.2

(51) Int. Cl.
F28F 7/00    (2006.01)
H05K 7/20    (2006.01)

(52) U.S. Cl.
CPC ..... *H05K 7/20272* (2013.01); *H05K 7/20254* (2013.01)

(58) Field of Classification Search
CPC ....................... H05K 7/20272; H05K 7/20254
USPC ........................................................ 165/80.4
See application file for complete search history.

(56) References Cited

FOREIGN PATENT DOCUMENTS

| CN | 215420355 U | * | 1/2022 |
| CN | 114466556 A | * | 5/2022 |
| CN | 114615866 A | * | 6/2022 |

* cited by examiner

*Primary Examiner* — Davis D Hwu

(57) ABSTRACT

A liquid cooling device includes a base plate, a cooling body, and a cover plate. The cooling body includes a frame. A cooling layer is provided in the frame and a reflux layer is provided above the cooling layer. The cooling layer is provided with a plurality of cooling channels extending from a center portion of the cooling body to the frame. The reflux layer is provided with a plurality of reflux channels in communication with the plurality of cooling channels. A periphery of the reflux layer is provided with a drainage flow channel in communication with the plurality of the reflux channels. A center portion of the cover plate being provided with a liquid inlet in communication with the plurality of cooling channels, and the cover plate is further provided with a liquid outlet in communication with the drainage flow channel.

13 Claims, 4 Drawing Sheets

LIQUID COOLING DEVICE

CROSS-REFERENCE TO RELATED APPLICATIONS

This application claims priority of Chinese Patent Application No. 202211104761.2, filed on Sep. 9, 2022, the content of which is hereby incorporated by reference in its entirety.

TECHNICAL FIELD

The present disclosure relates to the technical field of cooling devices, in particular to a liquid cooling device.

BACKGROUND

With the rapid development of the electronics industry, the thermal design power consumption and heat flux density of electronic components of a server are increasing, and the thermal design power consumption of the electronic component can even reach 300 W. Currently, a cooling plate is widely used as an efficient way to dissipate heat. Compared with air cooling, the cooling plate has a larger specific heat capacity and a higher heat transfer coefficient.

In the prior art, water in the cooling plate usually flows from one side to the other side, so that a part of the water flow does not flows through a heat-generating area for heat exchange, a utilization rate of the water is low. In addition, during the entire flow process of the water in the cooling plate, the pressure drop is generally large, resulting in poor cooling effect, and a more powerful circulating water pump is required to drive the water to flow in the cooling plate, which greatly increases a cooling cost.

SUMMARY

According to some exemplary embodiments of the present disclosure, a liquid cooling device is provided.

A liquid cooling device includes a base plate configured to be provided on a heat source, a cooling body provided on a side of the base plate away from the heat source, and a cover plate. The cooling body includes a frame. A cooling layer is provided in the frame and a reflux layer is provided above the cooling layer. The cooling layer is provided with a plurality of cooling channels extending from a center portion of the cooling body to the frame. The reflux layer is provided with a plurality of reflux channels in communication with the plurality of cooling channels. A periphery of the reflux layer is provided with a drainage flow channel in communication with the plurality of the reflux channels. The cover plate is provided on a side of the cooling body away from the base plate. A center portion of the cover plate is provided with a liquid inlet in communication with the plurality of cooling channels, and the cover plate is further provided with a liquid outlet in communication with the drainage flow channel.

These and other objects, advantages, purposes and features will become apparent upon review of the following specification in conjunction with the drawings.

BRIEF DESCRIPTION OF THE DRAWINGS

In order to more clearly explain the embodiments of the present disclosure or the technical solutions in the related art, the accompanying drawings that need to be used in the description of the embodiments or the related art will be briefly described below. It is clear that the drawings in the following description are only the embodiments of the present disclosure. For those skilled in the art, other drawings can be obtained according to the disclosed drawings without paying creative labor.

DETAILED DESCRIPTION OF THE EMBODIMENTS

Figure 1:
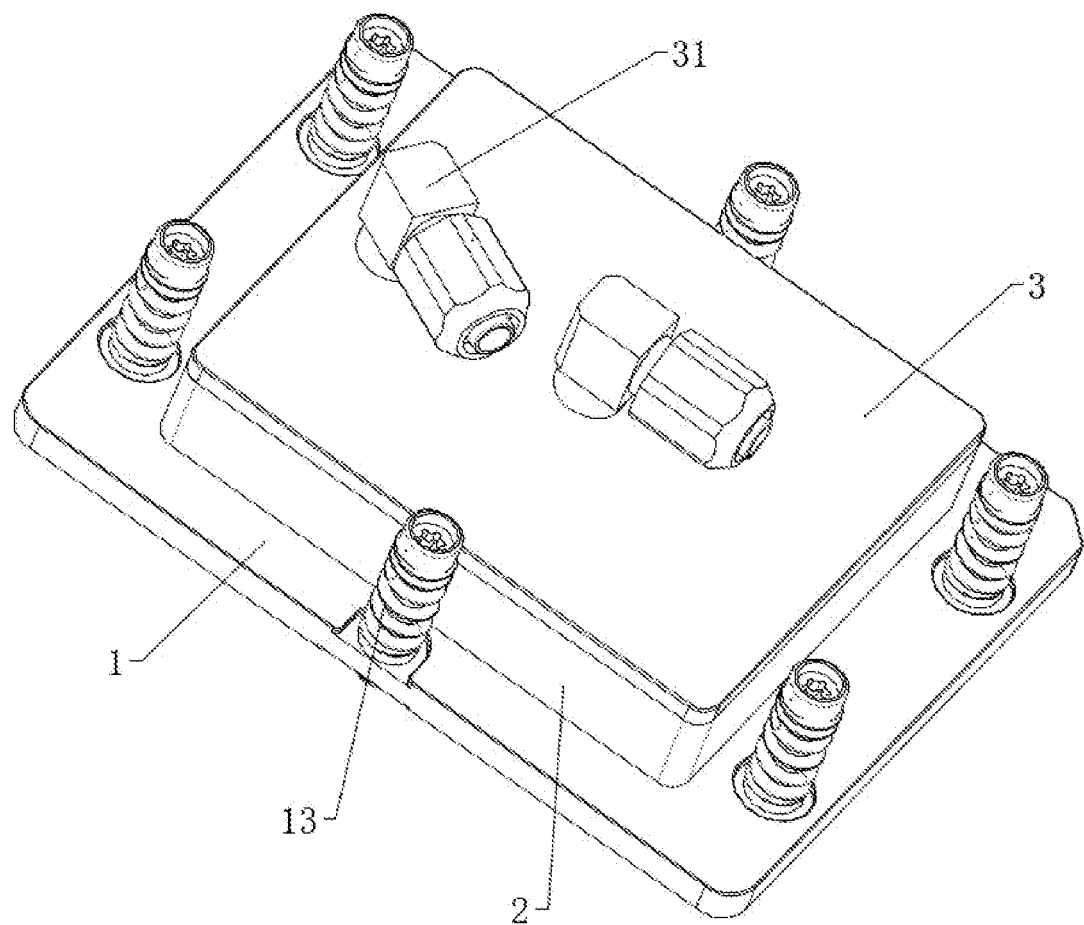
FIG. 1 is a perspective view of a liquid cooling device according to an embodiment of the present disclosure.

Embodiments of the present disclosure are described in detail below, and examples of the embodiments are shown in the drawings. The same or similar reference numerals denote the same or similar elements or elements having the same or similar functions. The embodiments described below by referring to the figures are exemplary and are intended to explain the present disclosure and should not be construed as limiting the present disclosure.

In the description of the present disclosure, it should be noted that the terms center", "upper", "lower", "left", "right", "vertical", "horizontal", "inner", "outer", etc., indicated orientations or positional relationships are based on the orientations or positional relationships shown in the accompanying drawings, and are only for the convenience of describing the present disclosure and simplifying the description, rather than indicating or implying that the referred device or element must have a specific orientation, or be constructed and operate in a particular orientation, so it should not be understood as a limitation of the present disclosure. In addition, the terms "first" and "second" are used for descriptive purposes only, and should not be understood as indicating or implying relative importance. The terms "first position" and "second position" are two different positions.

In the present disclosure, unless otherwise expressly specified and limited, the terms "mount", "connect", "contact", "fix" and other terms should be understood in a broad sense, for example, they can be fixed connections, removable connections, or integrated. It can be mechanical connection or electrical connection. It can be directly connected or indirectly connected through an intermediate medium. It can be the connection within two elements or the interaction relationship between two elements, unless otherwise expressly limited. For those skilled in the art, the specific meaning of the above terms in the present application can be understood according to the specific situation.

The technical solutions of the present disclosure will be further described below in conjunction with the accompanying drawings and specific embodiments.

Figure 2:
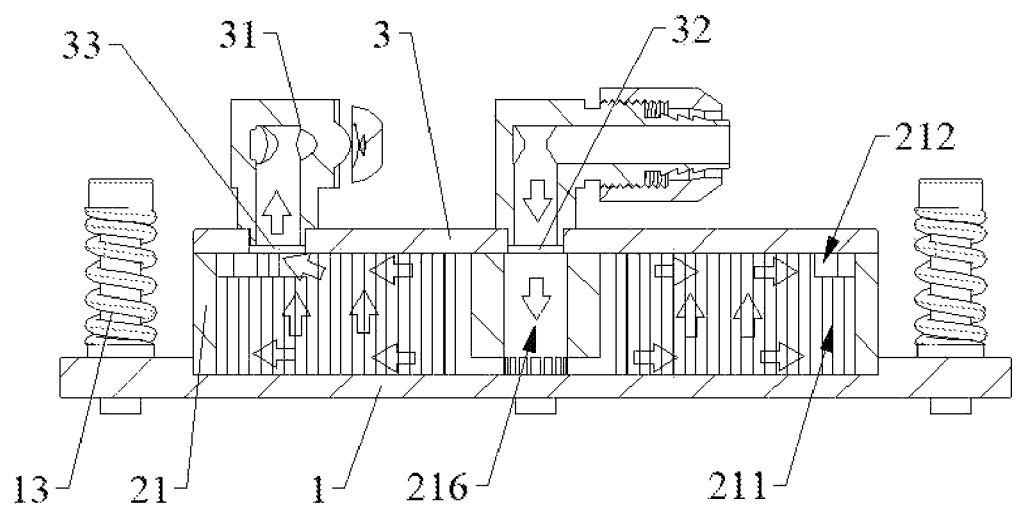
FIG. 2 is a cross-sectional view of the liquid cooling device of FIG. 1.
Figure 3:
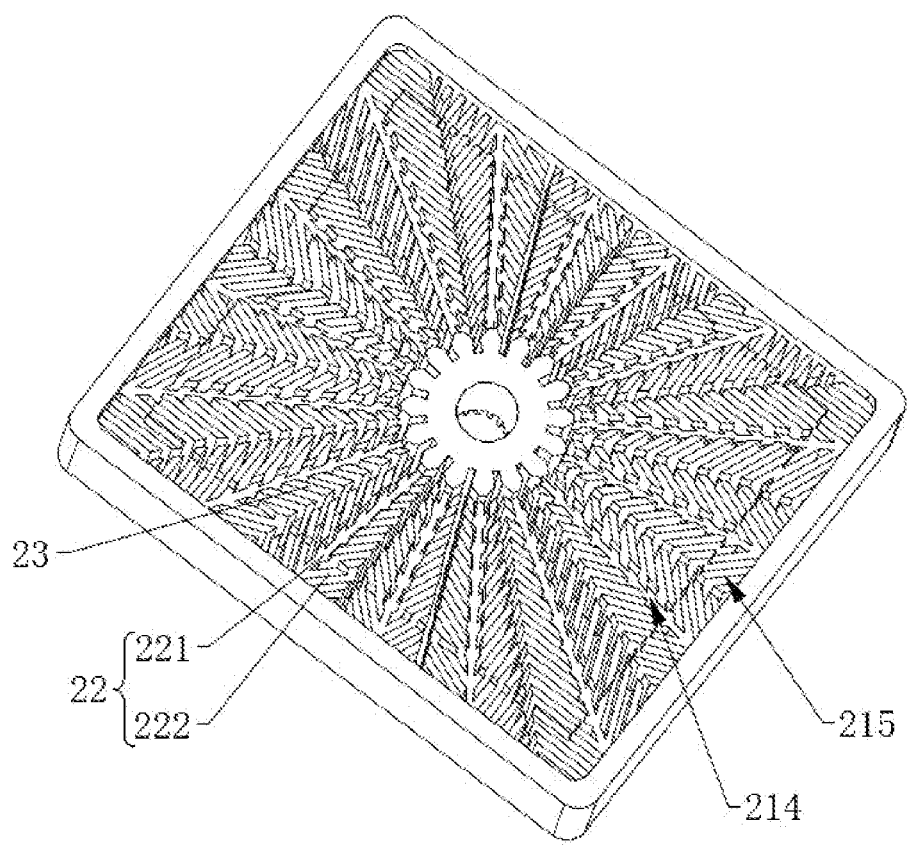
FIG. 3 is a perspective view of a cooling body of FIG. 1.
Figure 4:
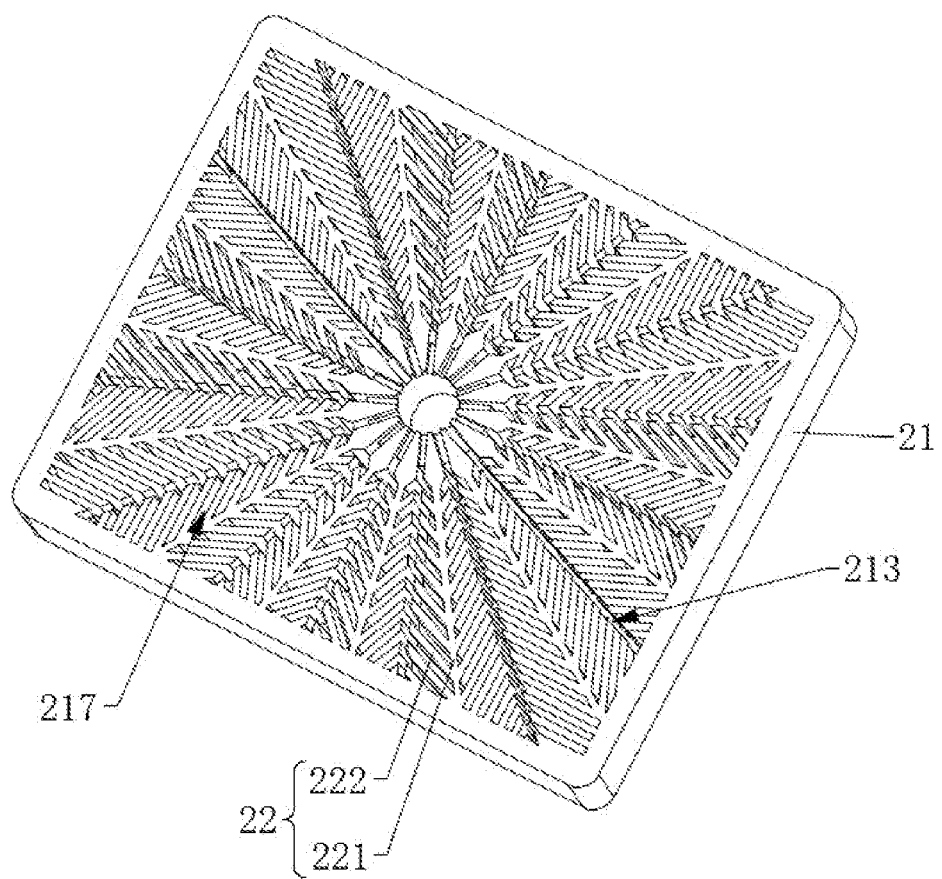
FIG. 4 is a perspective view of the cooling body of FIG. 3 viewed from another aspect.
Figure 5:
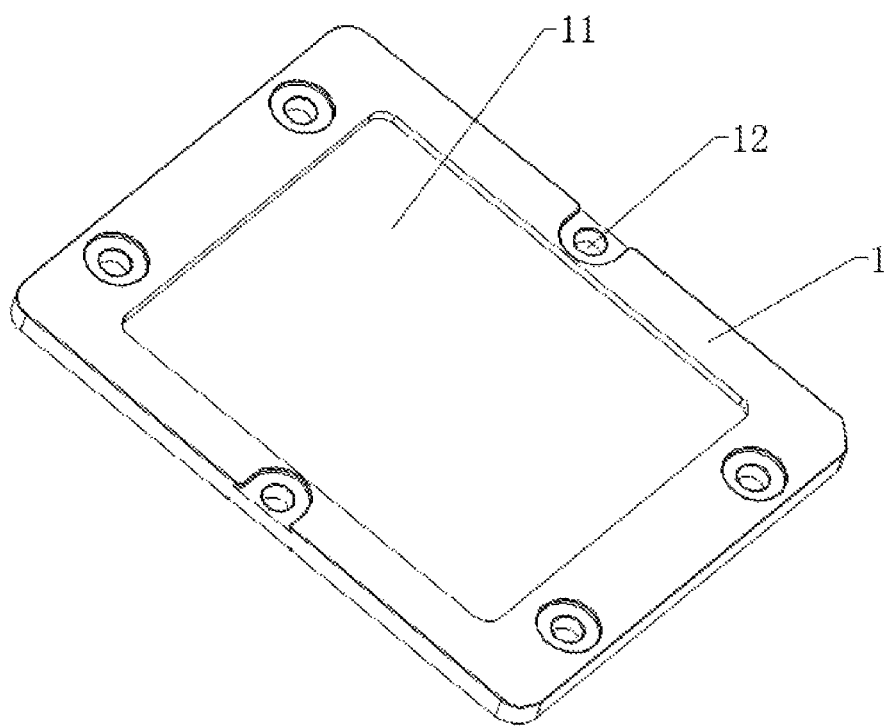
FIG. 5 is a perspective view of a base plate of FIG. 1.

As shown in FIGS. 1 to 5, according to an embodiment, a liquid cooling device is provided, which includes a base plate 1, a cooling body 2, and a cover plate 3. The base plate 1 is configured to be provided on a heat source (not shown), the cooling body 2 is provided on a side of the base plate 1 away from the heat source. The cooling body 2 includes a frame 21, a cooling layer 211, and a reflux layer 212. The frame 21 is a substantially rectangular ring. The cooling layer 211 is located in and surrounded by the frame 21, and the reflux layer 212 is provided above the cooling layer 211. The cooling layer 211 is provided with a plurality of cooling channels 213 extending from a center portion of the cooling body 2 to the frame 21. The reflux layer 212 is provided with a plurality of reflux channels 214 in communication with the plurality of cooling channels 213. A periphery of the reflux layer 212 is provided with a drainage flow channel 215 in communication with the plurality of reflux channels 214. The cover plate 3 is provided on a side of the cooling body 2 away from the base plate 1. A center portion of the cover plate 3 is provided with a liquid inlet 32 in communication with the plurality of cooling channels 213, and the cover plate 3 is further provided with a liquid outlet 33 in communication with the drainage flow channel 215.

By providing the cooling body 2 between the base plate 1 and the cover plate 3, the heat source under the base plate 1 can be cooled. The cooling layer 211 and the reflux layer 212 are provided in the frame 21 of the cooling body 2, so that coolant entering the cooling body 2 through the liquid inlet 32 of the cover plate 3 can flow to the cooling layer 211 by gravity, so as to cool the heat source, which does not require a high-power pump, thus saving a cooling cost. Since the reflux layer 212 is located above the cooling layer 211, the coolant located in the lower portion of the cooling layer 211 can be fully utilized, and the utilization rate of the coolant can be effectively improved. In addition, by providing the liquid inlet 32 at the center portion of the cooling body 2 and providing the drainage flow channel 215 and the liquid outlet 33 at the frame 21, the coolant can firstly cool a center portion of the heat source, so that the cooling effect for the heat source with a high central heat generation is improved.

As an alternative embodiment, a center portion of the cooling body 2 is provided with a liquid inlet 32 channel 216 in communication with the liquid inlet 32 and the cooling channel 213. By providing the liquid inlet 32 channel 216, the flowing of the coolant between the liquid inlet 32 and the reflux layer 212 can be effectively avoided, so that the coolant entering through the liquid inlet 32 can flow into the cooling layer 211 directly, then diffuse through the cooling channel 213, and finally flows out of the liquid outlet 33 of the cover plate 3 through the reflux layer 212.

Specifically, the cooling layer 211 includes a plurality of partition structures 22 extending from the center portion of the cooling body 2 to the frame 21. The cooling channel 213 is formed between adjacent two partition structures 22. By providing the partition structures 22 extending from the center portion of the cooling body 2 to the frame 21, the cooling channel 213 also extends from the center portion of the cooling body 21 to the frame 21, which is beneficial to speed up the diffusion speed of the coolant, so as to reduce a flow resistance.

Further, the partition structure 22 includes a partition rib 221 extending from the center portion of the cooling body 2 to the frame 21 and a plurality of partition blades 222 provided on both sides of the partition rib 221. An end of the partition blade 222 away from the partition rib 221 extends toward the center portion of the cooling body 2. When the coolant enters the cooling channel 213 through the liquid inlet 32 channel 216, the coolant can flow sequentially between the plurality of partition blades 222, which effectively improves the flow efficiency of the coolant. A cooling position 217 in communication with the cooling channel 213 is formed between adjacent two partition blades 222. The cooling position 217 can ensure sufficient heat exchange between the coolant and the heat source, and the cooling position 217 can help to increase the diffusion speed of the coolant from the center portion of the cooling body 2 to the frame 21, thereby reducing the flow resistance.

It should be noted that the coolant in the cooling position 217 will gradually accumulate until a height of the coolant reaches the reflux layer 212. The coolant in the cooling position 217 will form a convection. The coolant with a higher temperature has a lower density and will generate a lifting force, so as to be located in an upper portion of the cooling body 2. On the one hand, the circulation of coolant in cooling position 217 can be promoted, and on the other hand, the coolant with higher temperature can be refluxed first, so that the coolant just entering the cooling position 217 can fully exchange heat with the heat source, and the utilization rate of the coolant is improved.

Further, at least one of the liquid inlet 32 and the liquid outlet 33 is provided with a quick-connect joint 31, so that the coolant can enter or flow out of the liquid cooling device, and the assembly and disassembly of the liquid cooling device can be more convenient. In an embodiment, the quick-connect joints 31 of the liquid inlet 32 and the liquid outlet 33 adopts a nut and cone design, which is beneficial to minimize the possibility of leakage.

In this embodiment, a height of the cooling layer 211 is about 3.5 to about 4.5 times of a height of the reflux layer 212, such that there is enough coolant to exchange heat with the heat source and ensure the heat exchange effect.

As an alternative embodiment, the reflux layer 212 is provided with a plurality of guiding blades 23. The reflux channel 214 is formed between adjacent two guiding blades 23. The guiding blade 23 and the partition blade 222 are overlapped, so that the coolant in the cooling position 217 can directly enter the reflux channel 214 between the adjacent two guiding blades 23 after rising. The guiding blades 23 are not only configured to enclose the reflux channel 214, but also can guide the reflux of the coolant, so that the refluxed coolant can flow to the drainage flow channel 215 adjacent to the frame 21 as soon as possible.

Further, the drainage flow channel 215 is formed between the guiding blades 23 adjacent to the frame 21 and the frame 21. The drainage flow channel 215 is in communication with the reflux channel 214. The coolant in the reflux channel 214 flows to the drainage flow channel 215 and finally flows out of the liquid cooling device through the liquid outlet 33 of the cover plate 3.

In an embodiment, a width of the drainage flow channel 215 adjacent to the liquid outlet 33 is greater than a width of the drainage flow channel 215 away from the liquid outlet 33, which is more beneficial for the coolant to be discharged from the liquid cooling device.

In this embodiment, the partition structures 22 and the frame 21 are integrally formed, which facilitates the processing of the partition structure 22. The guiding blade 23 and the partition structures 22 are also integrally formed, so that the overall thickness of the partition structure 22 and the guiding blade 23 is increased, and the strength is improved. The partition structure 22 and the guiding blade 23 can be used as a framework of the liquid cooling device, and the reliability of the liquid cooling device is increased.

In an embodiment, the cooling body 2 is made of aluminum or copper to ensure higher heat exchange efficiency. The above-mentioned integral molding may be aluminum extrusion molding. During processing, the drainage flow channel 215 can be processed by a milling machine, and the drainage flow channel 215 adjacent to the liquid outlet 33 can be milled off more pair of guiding blades 23, so that the width of the drainage flow channel 215 adjacent to the liquid outlet 33 is greater than the width of the drainage flow channel 215 away from the liquid outlet 33.

In an embodiment, the cover plate 3 is welded to the cooling body 2. The base plate 1 may be also welded to the cooling body 2. Since the welding connection is firm, the leakage of the coolant can be effectively avoided.

Further, the base plate 1 is provided with a mounting groove 11, and the cooling body 2 is mounted in the mounting groove 11. The mounting groove 11 can help to the positioning of the cooling body 2 and the base plate 1, and can also help to the sealing of the frame 21.

Optionally, in order to assemble the liquid cooling device, a periphery of the base plate 1 is provided with a plurality of mounting holes 12, and the liquid cooling device further includes a plurality of mounting assemblies 13 provided in the mounting holes 12. The plurality of mounting assemblies 13 are configured to be connected to the heat source. During assembling, a center portion of the liquid cooling device can be located on a portion of the heat source where generates the most heat to improve the cooling effect, and the liquid cooling device also has the advantages of small pressure drop and more reliable structure.

The technical features of the above embodiments can be combined arbitrarily. For the sake of brevity, all possible combinations of the technical features in the above embodiments are not described. However, as long as there is no contradiction in the combination of these technical features, it should be considered as the scope of this description.

The foregoing descriptions are merely specific embodiments of the present disclosure, but are not intended to limit the protection scope of the present disclosure. It should be pointed out that any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

What is claimed is:

1. A liquid cooling device, comprising:
   a base plate configured to be provided on a heat source;
   a cooling body provided on a side of the base plate away from the heat source, the cooling body comprising a frame, a cooling layer provided in the frame, and a reflux layer provided above the cooling layer, the cooling layer being provided with a plurality of cooling channels extending from a center portion of the cooling body to the frame, the reflux layer being provided with a plurality of reflux channels in communication with the plurality of cooling channels, a periphery of the reflux layer being provided with a drainage flow channel in communication with the plurality of the reflux channels; and
   a cover plate provided on a side of the cooling body away from the base plate, a center portion of the cover plate being provided with a liquid inlet in communication with the plurality of cooling channels, and the cover plate being further provided with a liquid outlet in communication with the drainage flow channel.

2. The liquid cooling device according to claim 1, wherein a center portion of the cooling body is further provided with a liquid inlet channel in communication with the liquid inlet and the plurality of cooling channels.

3. The liquid cooling device according to claim 1, wherein the cooling layer comprises a plurality of partition structures extending from the center portion of the cooling body to the frame, and the cooling channel is formed between adjacent two partition structures.

4. The liquid cooling device according to claim 3, wherein the plurality of partition structures and the frame are integrally formed.

5. The liquid cooling device according to claim 3, wherein each partition structure comprises a partition rib extending from the center portion of the cooling body to the frame and a plurality of partition blades provided on both sides of the partition rib, an end of the partition blade away from the partition rib extends toward the center portion of the cooling body, and a cooling position in communication with the cooling channel is formed between adjacent two partition blades.

6. The liquid cooling device according to claim 5, wherein the reflux layer comprises a plurality of guiding blades, the reflux channel is formed between adjacent two guiding blades, the guiding blade and the partition blade are overlapped, and the drainage flow channel is formed between the guiding blades adjacent to the frame and the frame.

7. The liquid cooling device according to claim 1, wherein a height of the cooling layer is about 3.5 to about 4.5 times of a height of the reflux layer.

8. The liquid cooling device according to claim 1, wherein a width of the drainage flow channel adjacent to the liquid outlet is greater than a width of the drainage flow channel away from the liquid outlet.

9. The liquid cooling device according to claim 1, wherein at least one of the liquid inlet and the liquid outlet is provided with a quick-connect joint.

10. The liquid cooling device according to claim 1, wherein the base plate is provided with a mounting groove, and the cooling body is mounted in the mounting groove.

11. The liquid cooling device according to claim 1, wherein the cover plate is welded to the cooling body.

12. The liquid cooling device according to claim 1, wherein the base plate is welded to the cooling body.

13. The liquid cooling device according to claim 1, wherein a periphery of the base plate is provided with a plurality of mounting holes, the liquid cooling device further comprises a plurality of mounting assemblies provided in the plurality of mounting holes, and the plurality of mounting assemblies are configured to be connected to the heat source.

* * * * *